(12) United States Patent
Lum

(10) Patent No.: US 8,982,643 B2
(45) Date of Patent: Mar. 17, 2015

(54) SHARED TRACKING CIRCUIT

(71) Applicant: Taiwan Semiconductor Manufacturing Company, Ltd., Hsinchu (TW)

(72) Inventor: Annie-Li-Keow Lum, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 41 days.

(21) Appl. No.: 13/799,402

(22) Filed: Mar. 13, 2013

(65) Prior Publication Data

US 2014/0177352 A1  Jun. 26, 2014

Related U.S. Application Data

(60) Provisional application No. 61/740,094, filed on Dec. 20, 2012.

(51) Int. Cl.
  *G11C 7/22* (2006.01)
  *G11C 11/419* (2006.01)
  *G11C 29/02* (2006.01)
  *G11C 29/04* (2006.01)

(52) U.S. Cl.
  CPC .............. *G11C 7/222* (2013.01); *G11C 11/419* (2013.01); *G11C 29/023* (2013.01); *G11C 29/028* (2013.01); *G11C 2029/0409* (2013.01)
  USPC .............................. 365/189.011; 365/230.03

(58) Field of Classification Search
  USPC ....................... 365/189.011, 230.03
  See application file for complete search history.

(56) References Cited

U.S. PATENT DOCUMENTS

2012/0051160 A1*  3/2012  Tao et al. ...................... 365/191

* cited by examiner

*Primary Examiner* — Huan Hoang
(74) *Attorney, Agent, or Firm* — Lowe Hauptman & Ham, LLP

(57) ABSTRACT

A system comprises a plurality of first memory macros and a first tracking circuit to be shared by the plurality of first memory macros. The first tracking circuit includes at least one of a first tracking circuit associated with a row of memory cells of a first memory macro of the plurality of first memory macros, a first tracking circuit associated with a column of memory cells of the first memory macro of the plurality of first memory macros, a first decoder tracking circuit associated with decoding circuitries of the first memory macro of the plurality of first memory macros, and a first input-output tracking circuit associated with input-output circuitries of the first memory macro of the plurality of first memory macros.

21 Claims, 15 Drawing Sheets

SHARED TRACKING CIRCUIT

CROSS-REFERENCE TO RELATED APPLICATION

The present application claims the priority of U.S. Application No. 61/740,094, filed Dec. 20, 2012, which is incorporated by reference herein in its entirety.

FIELD

The present disclosure is related to a tracking circuit that is shared among different memory macros.

BACKGROUND

Most synchronous memory macros each include a tracking circuit to identify a time delay in a read or a write path of the memory macros. Read or write signals of the memory macros are then generated based on the time delay. In various situations, however, the tracking circuit takes a large percentage of the memory macro die area.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
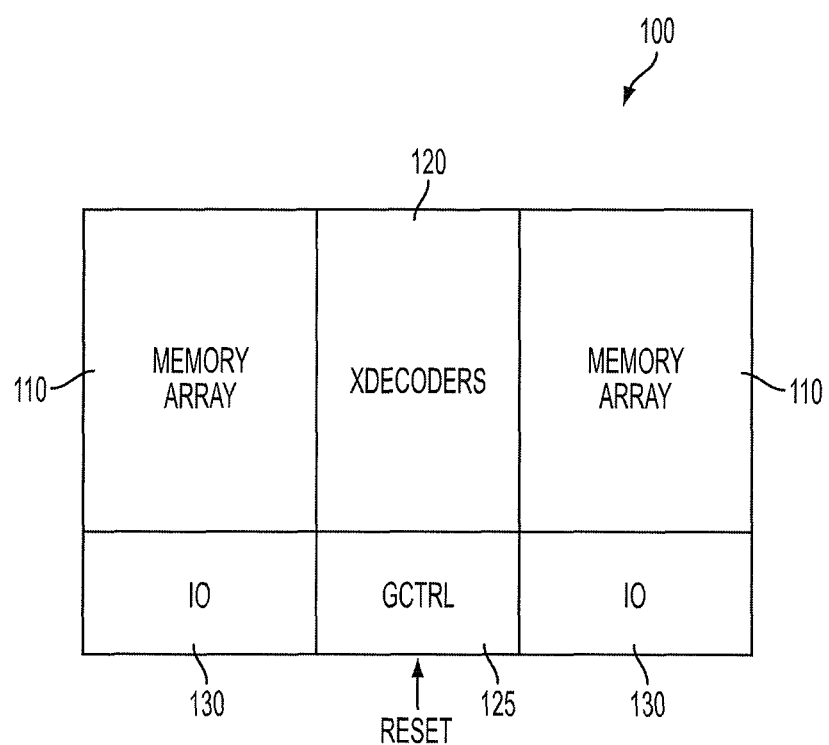
FIG. 1 is a diagram of a memory macro in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A tracking circuit is shared by a plurality of memory macros. As a result, the total die area of the plurality of memory macros and of the shared tracking circuit is reduced compared with the situation in which each of the plurality of memory macros includes a separate tracking circuit. To further reduce circuit layouts and a total die area, in some embodiments, both a load and a driving capability of a tracking driver are reduced based on a reduction ratio. Electrical lines in the share tracking circuit, including tracking word lines, tracking bit lines, etc., are also reshaped to reduce layout areas.

Exemplary Memory Macro

FIG. 1 is a diagram of a memory macro 100, in accordance with some embodiments. Memory macro 100 is a static random access memory (SRAM) macro. Other types of memories are within the scope of various embodiments.

Memory macro 100 is symmetrical. For example, with reference to decoders XDECODER 120, or a global control circuit (GCTRL) 125, circuit elements on the left side of memory macro 100 are similar to circuit elements on the right side of memory macro 100. For another example, memory macro 100 includes two memory arrays 110. One memory array 110 is on the left side of memory macro 100 and one memory array 110 is on the right side of memory macro 100.

An input-output circuit IO 130 serves to transfer data between memory cells in a corresponding memory array 110 and other circuits outside of memory macro 100.

Global control GCTRL 125 provides the row address, the column address pre-decode, clock, and other signals for memory macro 100. Global control GCTRL 125 also controls data transfer between memory cells in the memory array and circuits outside of memory macro 100. A reset signal RESET received from a shared tracking circuit TRKNG in FIG. 2 is used to reset memory macro 100.

Memory System

Figure 2:
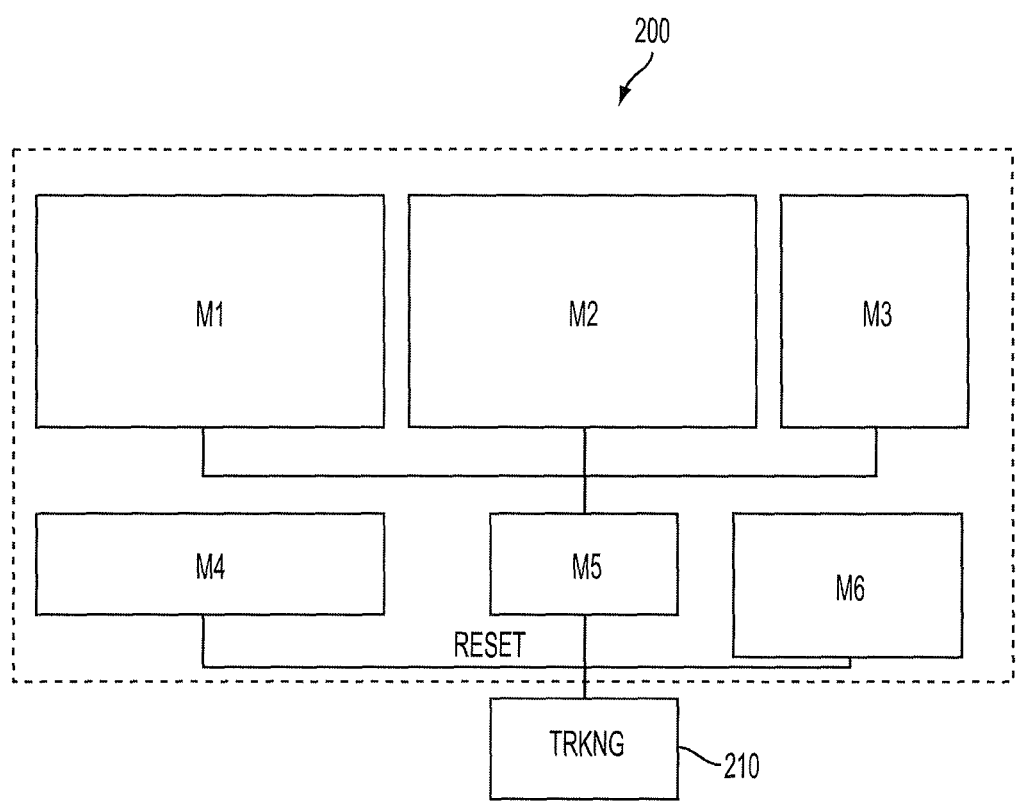
FIG. 2 is a diagram of a memory system having a plurality of memory macros in FIG. 1, in accordance with some embodiments.

FIG. 2 is a diagram of a memory system 200, in accordance with some embodiments. Memory system 200 includes six memory macros M1, M2, M3, M4, M5, and M6 and a tracking circuit TRKNG 210. For illustration, a memory macro M1 to M6 is a called a memory macro M, and is similar to memory macro 100 in FIG. 1. Six memory macros M are used for illustration. Another number of memory macros is within the scope of various embodiments.

Tracking circuit TRKNG 210 is shared by memory macros M1 to M6. Various embodiments of the present disclosure are advantageous over other approaches because each memory macro M1 to M6 does not include its own tracking circuit, but shares the same tracking circuit TRKNG 210. As a result, a die size of memory system 200 is smaller a die size of another memory system in which each memory macro includes its own tracking circuit.

In some embodiments, memory macros M1-M6 share a same clock signal based on which tracking signals are generated.

Tracking Circuit

Figure 3:
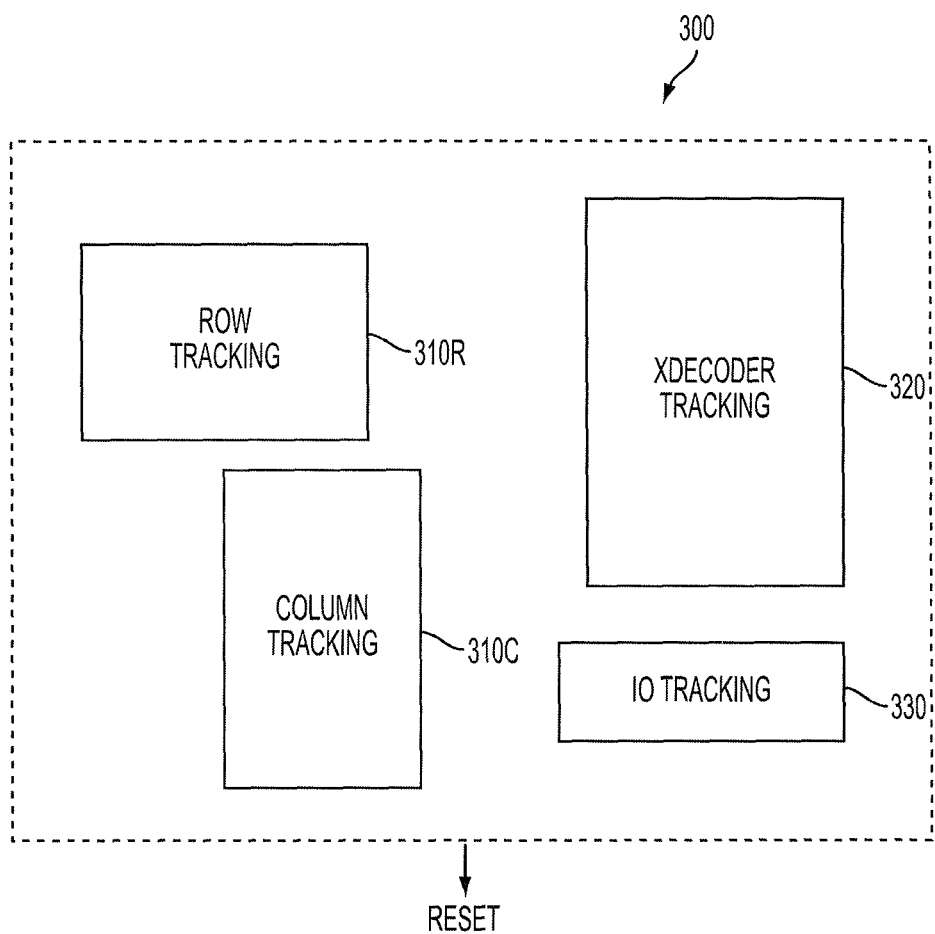
FIG. 3 is a diagram of the shared tracking circuit in the memory system of FIG. 2, in accordance with some embodiments.

FIG. 3 is a diagram of a tracking circuit 300, in accordance with some embodiments. Tracking circuit 300 is an embodiment of tracking circuit TRKNG 210. Tracking circuit 300 includes sub tracking circuits to provide tracking information for memory arrays 110, XDECODERS 120, and IOs 130.

A tracking circuit 310C provides tracking information and signals for rows of memory cells of memory array 110.

A tracking circuit 310R provides tracking information and signals for columns of memory cells of memory array 110.

An Xdecoder tracking circuit 320 provides tracking information and signals for XDECODERS 120.

An IO tracking circuit 330 provides tracking information and signals for IOs 130.

Reducing Layouts of Tracking Circuit

Figure 4:
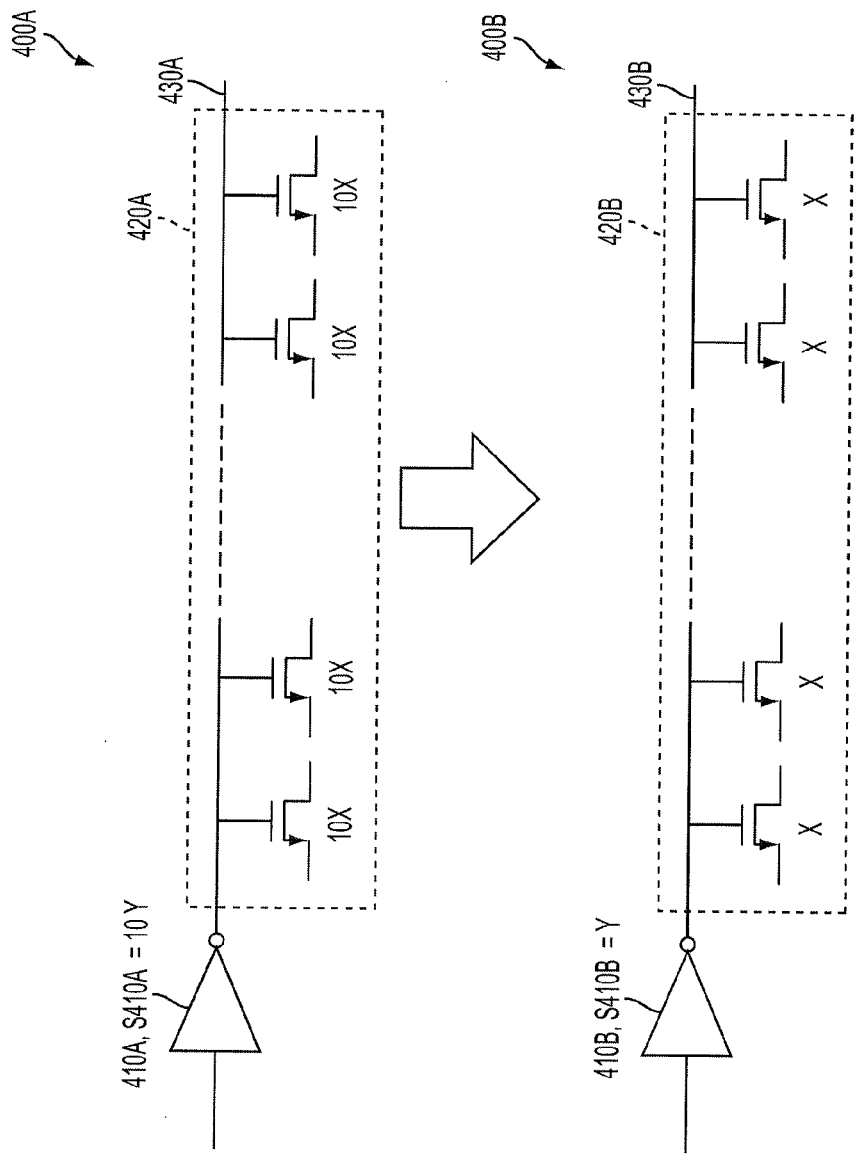
FIG. 4 is a diagram of example circuits used to illustrate techniques to reduce circuit layouts of the shared tracking circuit in FIG. 2, in accordance with some embodiments.

FIG. 4 is a diagram of circuits 400A and 400B, in accordance with some embodiments. Circuits 400A and 400B are used to illustrate techniques to reduce a circuit layout when sub tracking circuits 310R, 310C, 320, and 330 in FIG. 3 are each implemented in various embodiments of the present disclosure.

Circuit 400A includes a driver 410A and a circuit load 420A having a plurality of first transistors. The plurality of first transistors in circuit 420A asserts an electrical load L420A (not labeled) on circuit 410A. As a result, driver 410A is designed to provide a driving capability sufficient to drive load L420A. In some embodiments, a driving capability of driver 410A is proportional to a size of driver 410A. For illustration, driver 410A has a size S410A of 10Y. Size S410A corresponds to load L420A. The plurality of transistors is coupled with a line 430A that has a resistance R430A (not labeled) and a capacitance C430A (not labeled).

Circuit 400B includes a driver 410B and a circuit load 420B having a plurality of second transistors. For illustration, driver 410B has a size S410B, and load circuit 420B asserts a load L420B (not labeled) on driver 410B. Size S410B thus corresponds to load L420B. For illustration, size S410B is Y, which, compared with size S410A, is reduced based on a ratio R of 1/10. Similarly, load L420B is also 1/10 of load L420A, which is also based on reduction ratio RAT. The plurality of second transistors is coupled with a line 430B that has a resistance R430B (not labeled) and a capacitance C430B (not labeled). Based on reduction ration RAT, resistance R430B and capacitance C430B are each also 1/10 of corresponding resistance R430A and capacitance C430A.

Various ways to generate load L420B based on reduction ratio RAT with respect to load L420A are within the scope of various embodiments. For example, there are 20 first transistors in circuit 420A. Each first transistor has a size 10 X. In some embodiments, circuit 420B includes 20 second transistors, and each second transistor has a size X that is 1/10 of the size 10X of each first transistor in circuit 420A. Effectively, with reference to circuit 420A, the load of circuit 420B is reduced based on ratio RAT having a value 1/10. In some other embodiments, circuit 420B includes two second transistors, and each second transistor has the same size as each first transistor in circuit 420A. As a result, compared with the load of circuit 420A, the load of circuit 420 is reduced by ratio RAT of 1/10. Similarly, different ways to provide resistance R430B and capacitance C430B based on ratio RAT and corresponding resistance R430A and capacitance C430A are within the scope of various embodiments. Ratio RAT of 1/10 is used for illustration. Other values of ratio RAT are within the scope of various embodiments. In some embodiments, a value of ratio RAT is determined based on a layout area allocated for tracking circuit 300. For example, a smaller area is available for tracking circuit 300, a larger a reduction ratio RAT from circuit 420A to circuit 420B is selected.

Figure 5:
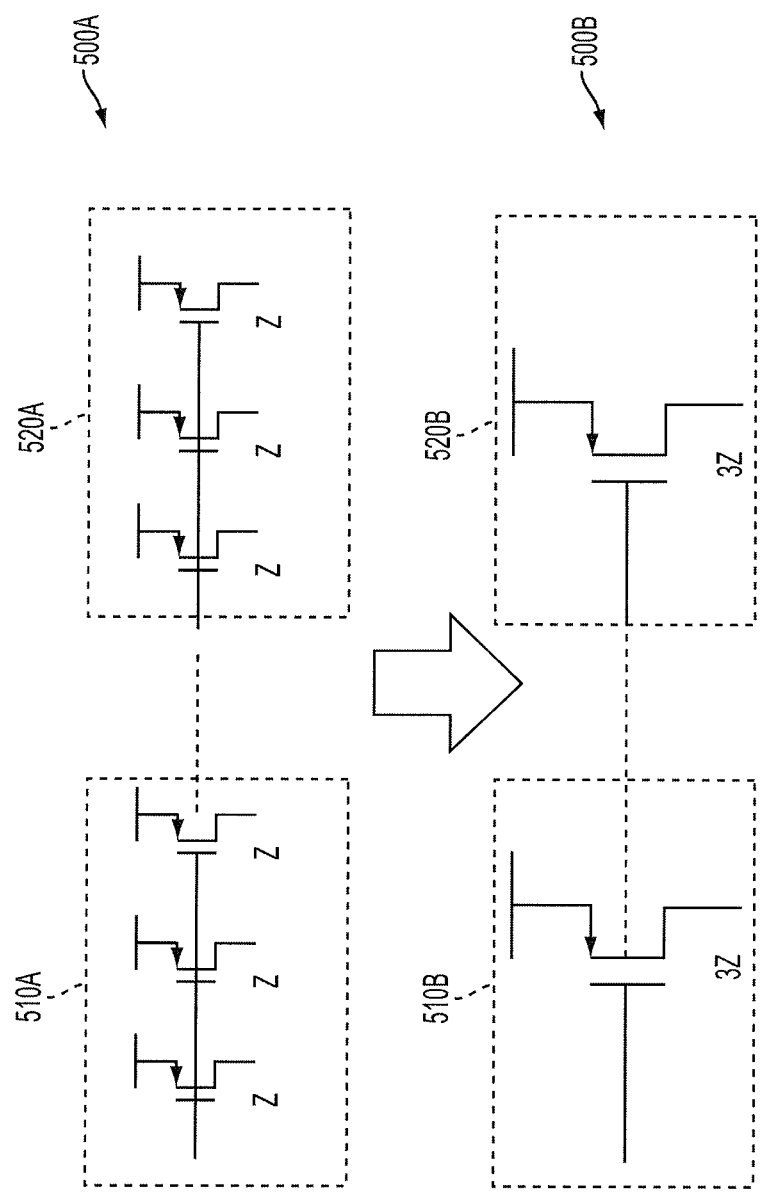
FIG. 5 is a diagram of example circuits used to illustrate other techniques to reduce circuit layouts of the shared tracking circuit in FIG. 2, in accordance with some further embodiments.

FIG. 5 is a diagram of circuits 500A and 500B, in accordance with some embodiments. Circuits 500A and 500B are used to illustrate a plurality of transistors is combined into one transistor to reduce circuit layouts.

Circuit 500A includes two groups of transistors 510A and 520A. Groups of transistors 510A and 520A each include three transistors. Each transistor has a size Z.

Circuit 500B includes two transistors 510B and 520B. Transistor 510B has a size 3Z, which is a total size of three transistors in group 510A. Similarly, transistor 520B also has a size 3Z, which is a total size of three transistors in group 520A. A layout of circuit 500B is smaller than a layout of circuit 500A.

The number of transistors in circuit 510A or 520A to be combined into one transistor in circuit 510B or 520B is determined also based on layout considerations.

In FIG. 5, two groups of transistors in each of circuits 500A and 500B are used for illustration. A different number of groups are within the scope of various embodiments. Each group including three transistors is also for illustration. A different number of transistors in each group are within the scope of various embodiments. Transistors in circuits 500A and 500B are used for illustration. Other circuit elements are within the scope of various embodiments. Exemplary circuit elements include a logic gate, such as an AND gate, a NAND gate, an OR gate, etc.

Figure 6:
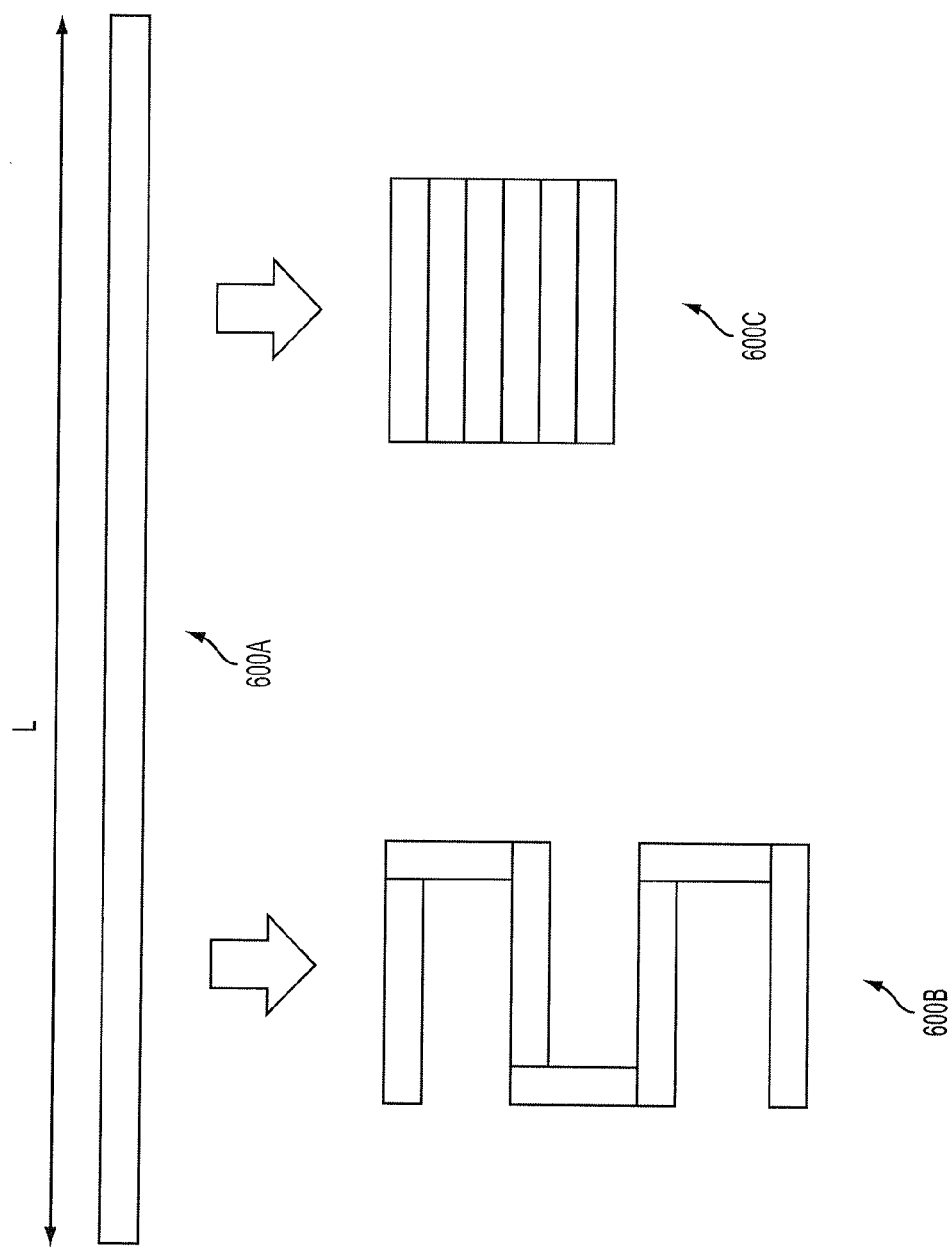
FIG. 6 is a diagram of example layout patterns used to illustrate additional techniques to reduce the die area occupied by the shared tracking circuit in FIG. 2, in accordance with some embodiments.

FIG. 6 is a diagram of example layout patterns of lines 600A, 600B, and 600C, in accordance with some embodiments. Lines 600A, 600B, and 600C are used to illustrate another way of reducing a circuit layout area and a die area for tracking circuit 300 in FIG. 3.

Line 600B has a total resistance as a resistance of line 600A. Line 600C has a total capacitance as a capacitance of line 600A.

Lines 600A, 600B, and 600C each represent a metal line, a loading line, or other lines used in memory system 200 in FIG. 2. Line 600A has a length L.

Line 600B is derived from line 600A to model a resistance value of line 600A in a different shape. For example, line 600B includes seven smaller lines continuously arranged in a zigzag style or a folded style as shown in FIG. 6. A total length of seven smaller lines in FIG. 600B is the same as length L of line 600A. A resistance value of line 600B is the same as a resistance value of line 600A. A shape of line 600B is shown for illustration. Other shapes resulting in a same resistance value as that of line 600A are within the scope of various embodiments.

Line 600C is derived from line 600A to model a capacitance value of line 600A in another different shape. For example, line 600C includes six smaller lines arranged as shown in FIG. 6. A capacitance value of line 600C is the same as a capacitance value of line 600A. A shape of line 600C is for illustration. Other shapes resulting in a same capacitance value as that of line 600A are within the scope of various embodiments.

In various embodiments, reshaping line 600A to line 600B, to line 600C, or to another line with a different shape is based on layout considerations, such the total die area being available or being saved when the line is reshaped.

Figure 7:
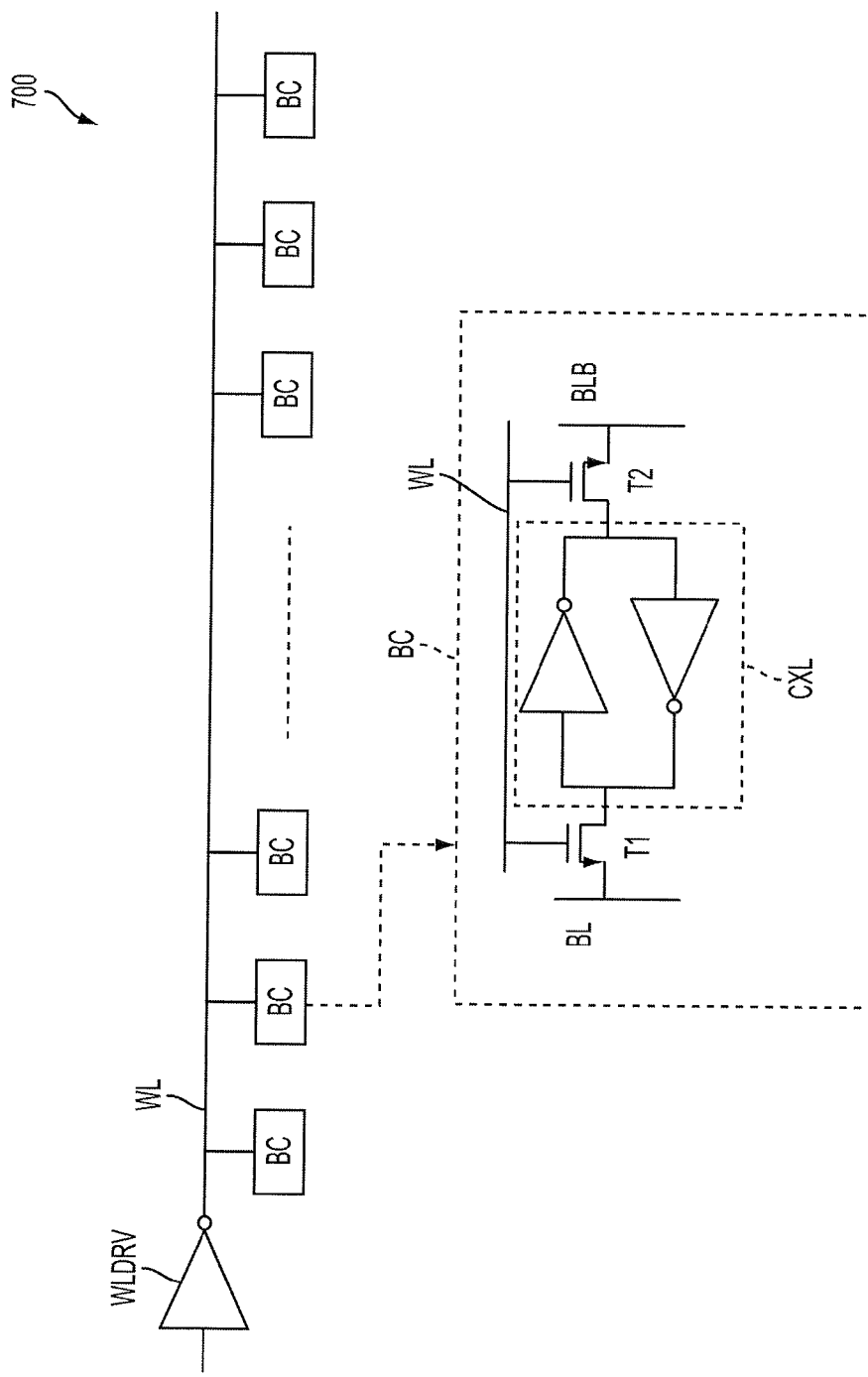
FIG. 7 is a diagram of a row of memory cells in a memory macro of the memory system in FIG. 2, in accordance with some embodiments.

FIG. 7 is a diagram of a circuit 700, in accordance with some embodiments. Circuit 700 includes a row of memory cells to be tracked by tracking circuit 310C in FIG. 3.

Circuit 700 includes a word line driver WLDRV, a word line WL, and a plurality of bit cells BC.

Details of a bit cell BC is shown for illustration. A first transistor T1 is coupled with a first bit line BL. A second transistor T2 is coupled with a second bit line BLB. A cross latch or a cross-coupled pair of inverters CLX is coupled with transistors T1 and T2. Word line WL is coupled to gates of transistors T1 and T2 of each bit cell BC.

Figure 8:
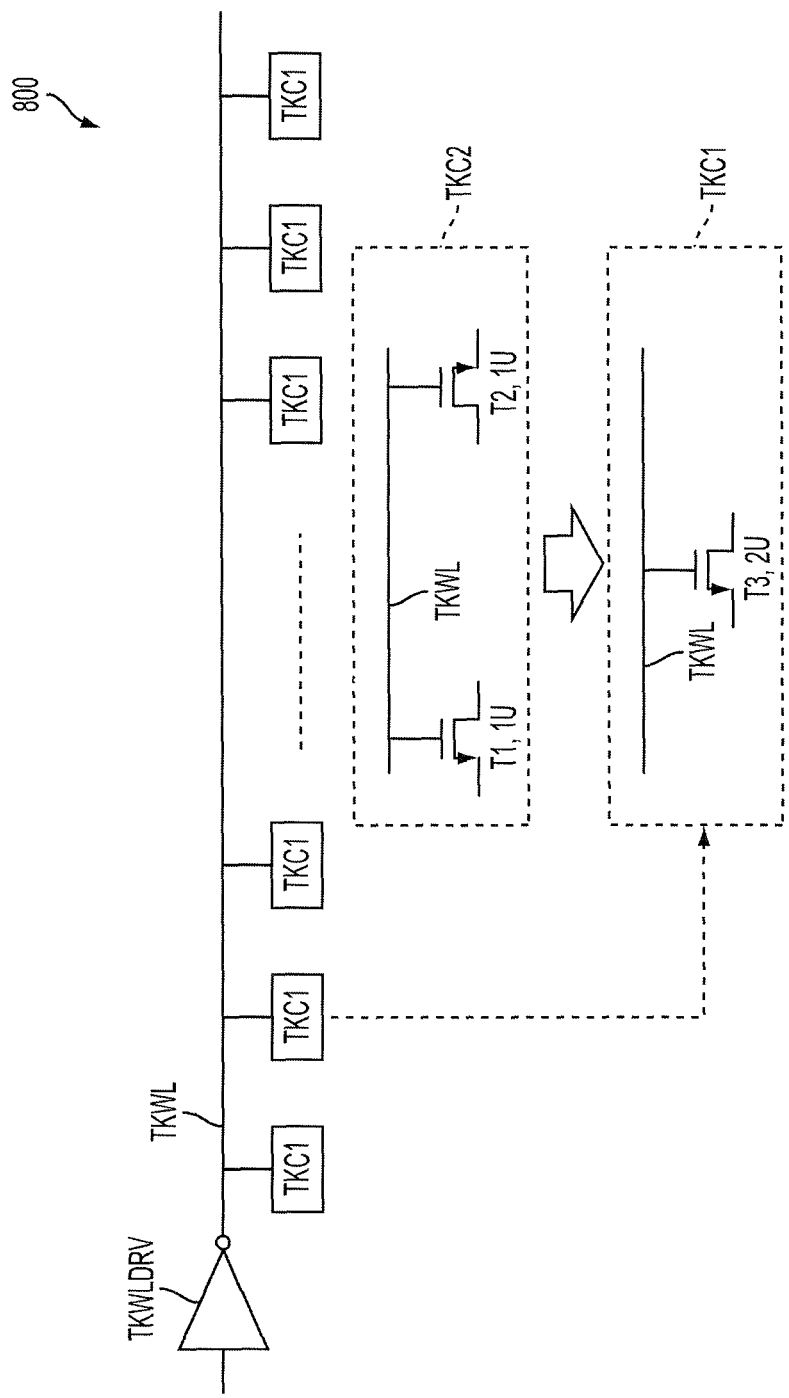
FIG. 8 is a diagram of a tracking circuit corresponding to the row of memory cells in FIG. 7, in accordance with some embodiments.

FIG. 8 is a diagram of a circuit 800, in accordance with some embodiments. Circuit 800 is implemented as an embodiment of tracking circuit 310C based on circuit 700.

Circuit 800 includes a tracking word line driver TKWLDRV, a tracking word line TKWL, and a plurality of tracking cells TKC1. Deriving circuit 800 from circuit 700 is accomplished in a manner similar to deriving circuit 400B from circuit 400A as illustrated in FIG. 4. For example, based on a reduction ratio RAT, such as 1/10, a driving capability of tracking word line driver TKWLDRV is about 1/10 of a driving capability of word line driver WLDRV. Based also on reduction ratio RAT of 1/10, the number of tracking cells TKC1 is also 1/10 of the number of bit cells BC.

In some embodiments, a size of tracking word line driver TKWLDRV is 1/10 a size of word line driver WLDRV in FIG. 7.

The number of tracking cells TKC1 is reduced by ratio RAT of 1/10, compared with the number of bit cells BC in FIG. 7. For example, the number of bit cells BC in FIG. 7 is 256. Based on reduction ratio RAT of 1/10, the number of tracking cells TKC1 is 26 (~256/10).

A tracking cell TKC2 is shown to illustrate how tracking cell TKC1 is formed based on bit cell BC in FIG. 7. Compared with bit cell BC in FIG. 7, tracking cell TKC2 does not include cross latch CXL because, in some embodiments, circuit elements coupled with tracking word line TKWL are considered as part of a load for tracking word line driver TKWLDR. Circuit elements that are not coupled with tracking word line TKWL are not part of a load for tracking word line driver TKWLDR. For example, only transistors T1 and T2 are coupled with tracking word line TKWL, and are part of a load for tracking word line driver TKWLDRV. Compared with bit cell BC, tracking cell TKC2 does not include bit lines BL and BLB, either.

In addition, using layout saving techniques illustrated with reference to FIG. 5, transistors T1 and T2 in tracking cell TKC2 are combined to form transistor T3 in tracking cell TKC1. For example, each of transistors T1 and T2 has a size of U. In some embodiments, transistor T3 has a size of 2U, which is a total size of transistors T1 and T2.

Tracking word line TKWL corresponds to word line WL in FIG. 7. In some embodiments, tracking word line TKWL has a shape different from a shape of word line WL, but has the same resistance as that of word line WL. Changing shape of word line WL to result in tracking word line TKWL having the same resistance as that of word line WL is illustrated by deriving line 600B from line 600A in FIG. 6. Alternatively and/or additionally, changing a shape of word line WL to result in tracking word line TKWL having the same capacitance as that of word line WL is illustrated by deriving line 600C from line 600A in FIG. 6.

Figure 9:
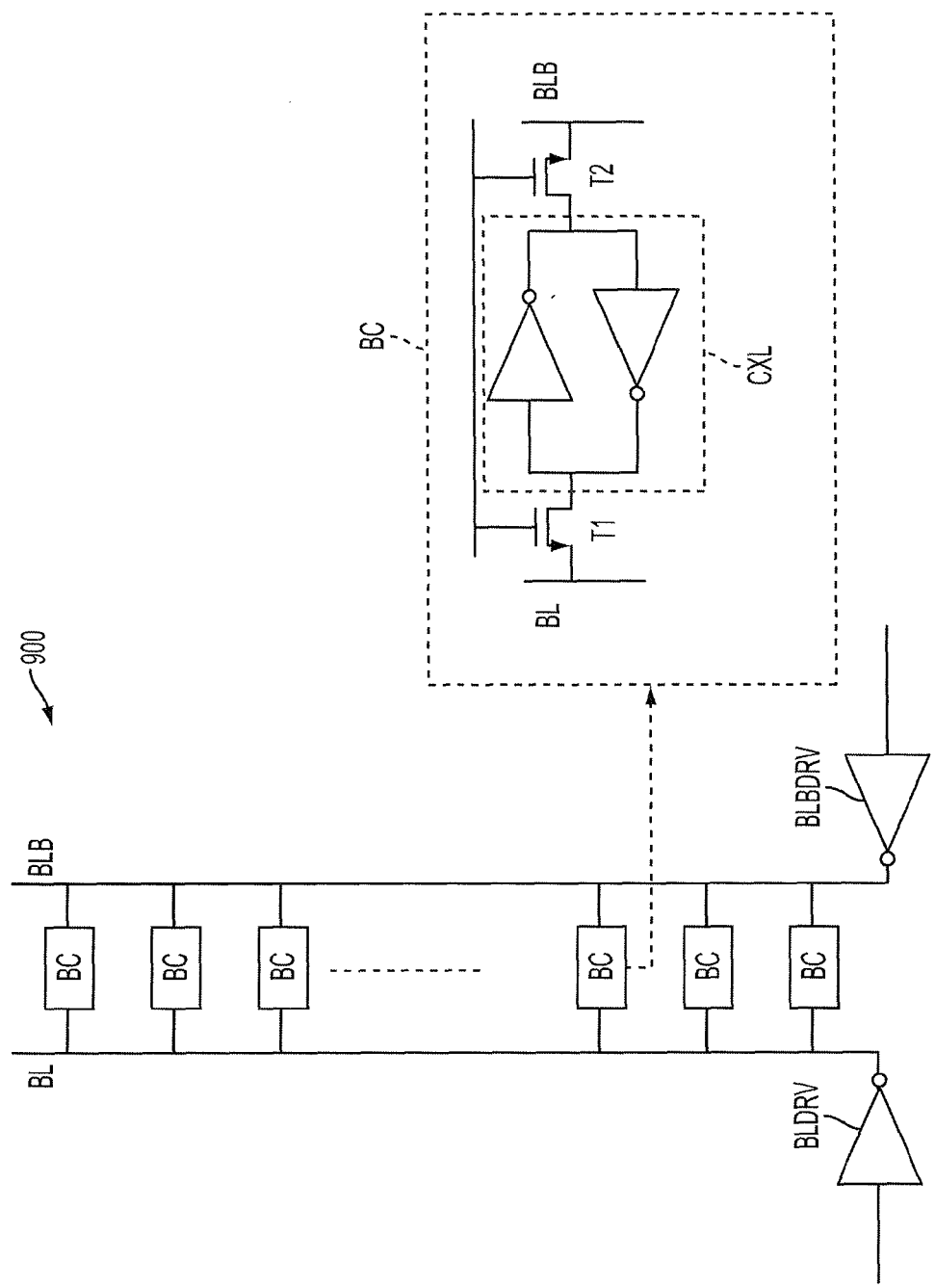
FIG. 9 is diagram of a column of memory cells in a memory macro of the memory system in FIG. 2, in accordance with some embodiments.

FIG. 9 is a diagram of a circuit 900, in accordance with some embodiments. Circuit 900 includes a column of memory cells or bit cells BC to be tracked by tracking circuit 310R in FIG. 3.

Circuit 900 includes a pair of bit line drivers BLDRV and BLBDRV, a pair of bit lines BL and BLB, and a plurality of bit cells BC.

Details of a bit cell BC is shown for illustration, which are similar to those of bit cell BC in FIG. 7. A cross latch or a cross-coupled pair of inverters CLX is coupled with transistors T1 and T2. Transistor T1 is coupled with a first bit line BL. Transistor T2 is coupled with a second bit line BLB.

Figure 10:
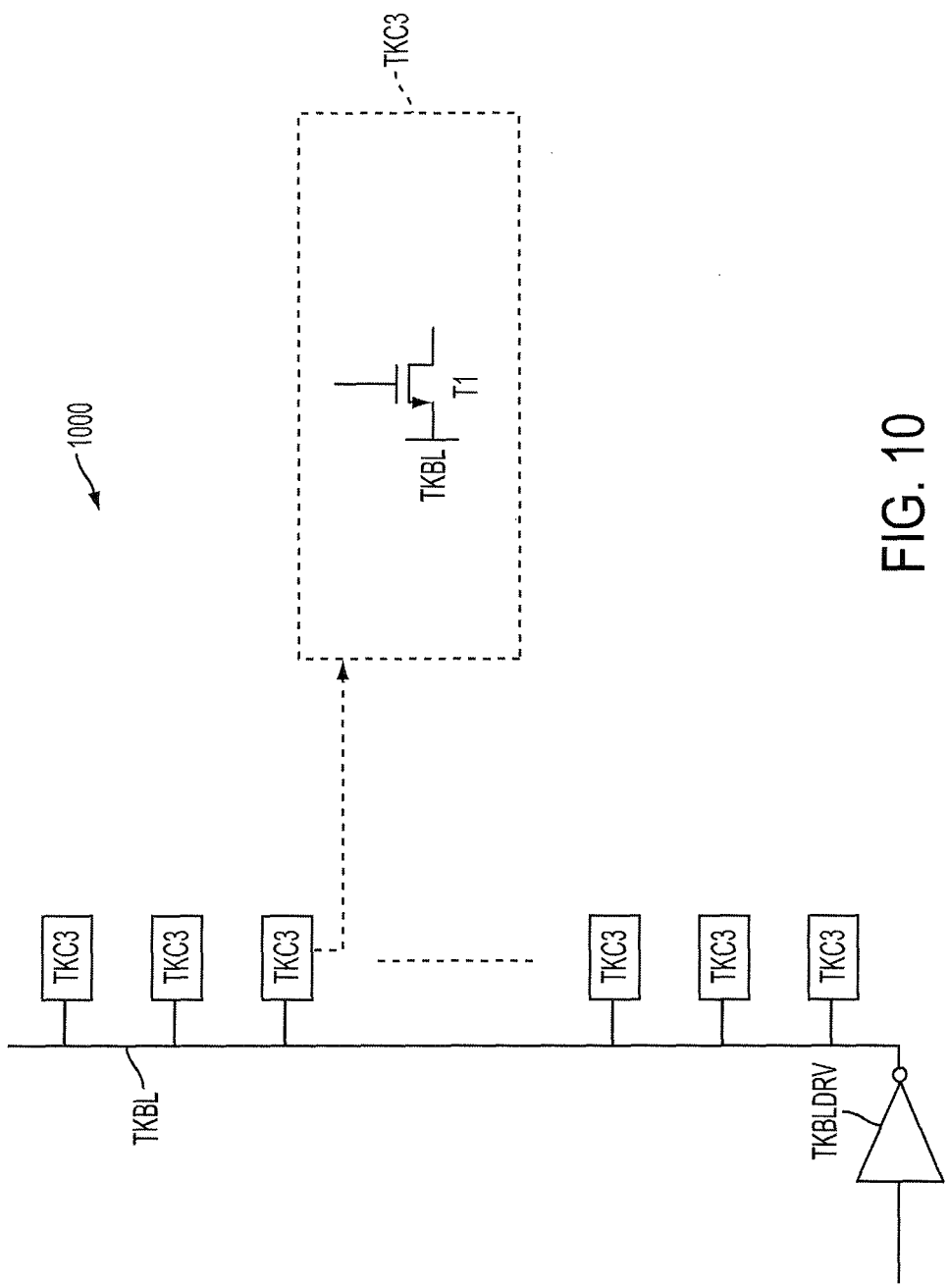
FIG. 10 is a diagram of a tracking circuit corresponding to the column of memory cells in FIG. 9, in accordance with some embodiments.

FIG. 10 is a diagram of a circuit 1000, in accordance with some embodiments. Circuit 1000 is implemented as an embodiment of tracking circuit 310R based on circuit 900.

Circuit 1000 includes a tracking bit line driver TKBLDRV, a tracking bit line TKBL, and a plurality of tracking cells TKC3. Deriving circuit 1000 from circuit 900 is done in a manner similar to deriving circuit 400B from circuit 400A as illustrated in FIG. 4. For example, based on a reduction ratio RAT of 1/10, a driving capability of tracking bit line driver TKBLDRV is about 1/10 of a driving capability of bit line driver BLDRV. The number of tracking cells TKC3 corresponds to the number of bit cells BC, also based on reduction ratio RAT of 1/10. A size of tracking bit line driver TKBLDRV, in some embodiments, is about 1/10 a size of bit line driver BLDRV in FIG. 9.

Compared with the number of bit cells BC in FIG. 9, the number of tracking cells TKC3 is also reduced by ratio RAT of 1/10. For example, the number of bit cells BC in FIG. 7 is 512. Based on reduction ratio RAT of 1/10, the number of tracking cells TKC3 is 52 (~512/10).

Compared with bit cell BC in FIG. 9, tracking cell TKC3 includes transistor T1 that is coupled with bit line TKBL and that is considered a part of a load for tracking bit line driver TKBLDRV.

Using layout saving techniques illustrated with reference to FIG. 5, multiple transistors T1 in multiple tracking cells TKC3 are combined to reduce layouts. For example, three transistors T1 in three tracking cells TKC3 are combined to result in a transistor having a size of three transistors T1.

Tracking bit line TKBL corresponds to bit line BL in FIG. 9. In some embodiments, tracking bit line TKBL has a different shape from a shape of bit line BL, but has the same resistance as that of bit line BL. Changing a shape of bit line BL to result in tracking bit line TKBL having the same resistance as that of bit line BL is illustrated by deriving line 600B from line 600A in FIG. 6. Alternatively and/or additionally, changing a shape of bit line BL to result in tracking bit line TKBL having the same capacitance as that of bit line BL is illustrated by deriving line 600C from line 600A in FIG. 6.

Tracking bit line driver TKBLDRV is associated with tracking bit line TKBL and transistor T1 to result in tracking circuit 1000, and is for illustration. In some embodiments, another tracking circuit is derived based on a bit line driver associated with bit line BLB and transistor T2 in a manner similar to deriving tracking circuit 1000. Detailed descriptions of such derivation are therefore omitted.

Figure 11:
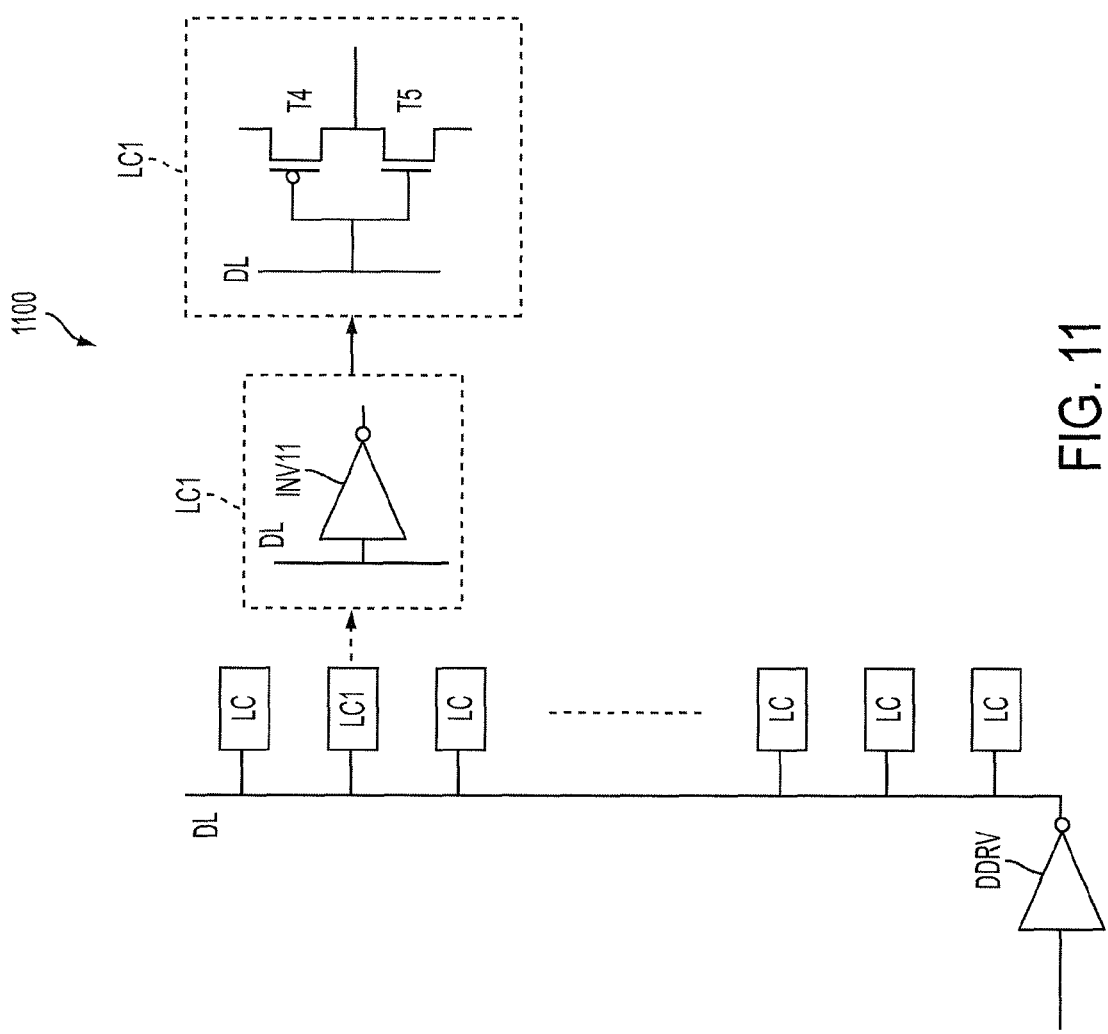
FIG. 11 is a diagram of a circuit representing Xdecoder circuits in a memory macro of the memory system in FIG. 2, in accordance with some embodiments.

FIG. 11 is a diagram of a circuit 1100, in accordance with some embodiments. Circuit 1100 represents circuit elements to be tracked by Xdecoder tracking circuit 320 in FIG. 3.

Circuit 1100 includes a driver DDRV, a data line DL, and a plurality of logic cells LC. In various embodiments, a logic cell LC includes a logic gate that is coupled with data line DL. For simplicity, details of the logic gates of logic cells LC are not shown. Examples of a logic gate include an inverter, an AND gate, a NAND gate, an OR gate, a NOR gate, a XOR gates, etc. Each of a logic gate is formed by a plurality of transistors.

In some embodiments, a group of logic cells LC of a plurality of groups of logic cells includes a particular type of logic gates. For example, a first group of logic cells LC includes one or a plurality of inverters. A second group of logic cells LC includes one or a plurality of NAND gates, and a third group of logic cells LC includes one or a plurality of NOR gates, etc. Various embodiments of the present disclosure are not limited by the types of logic gates or the number of logic gates included in a particular group.

For illustration, details of a logic cell LC1 are shown. Logic cell LC1 includes an inverter INV11. An input of inverter INV11 is coupled with data line DL, and an output of inverter INV is coupled with other circuits that are not shown. Inverter INV includes and is formed by transistors T4 and T5. Because transistors T4 and T5 of inverter INV are directly coupled with data line DL, transistors T4 and T5 affect the load of driver DDRV that drives data line DL. Transistors T4 and T5 are therefore considered in generating a tracking circuit illustrated in FIG. 12.

Figure 12:
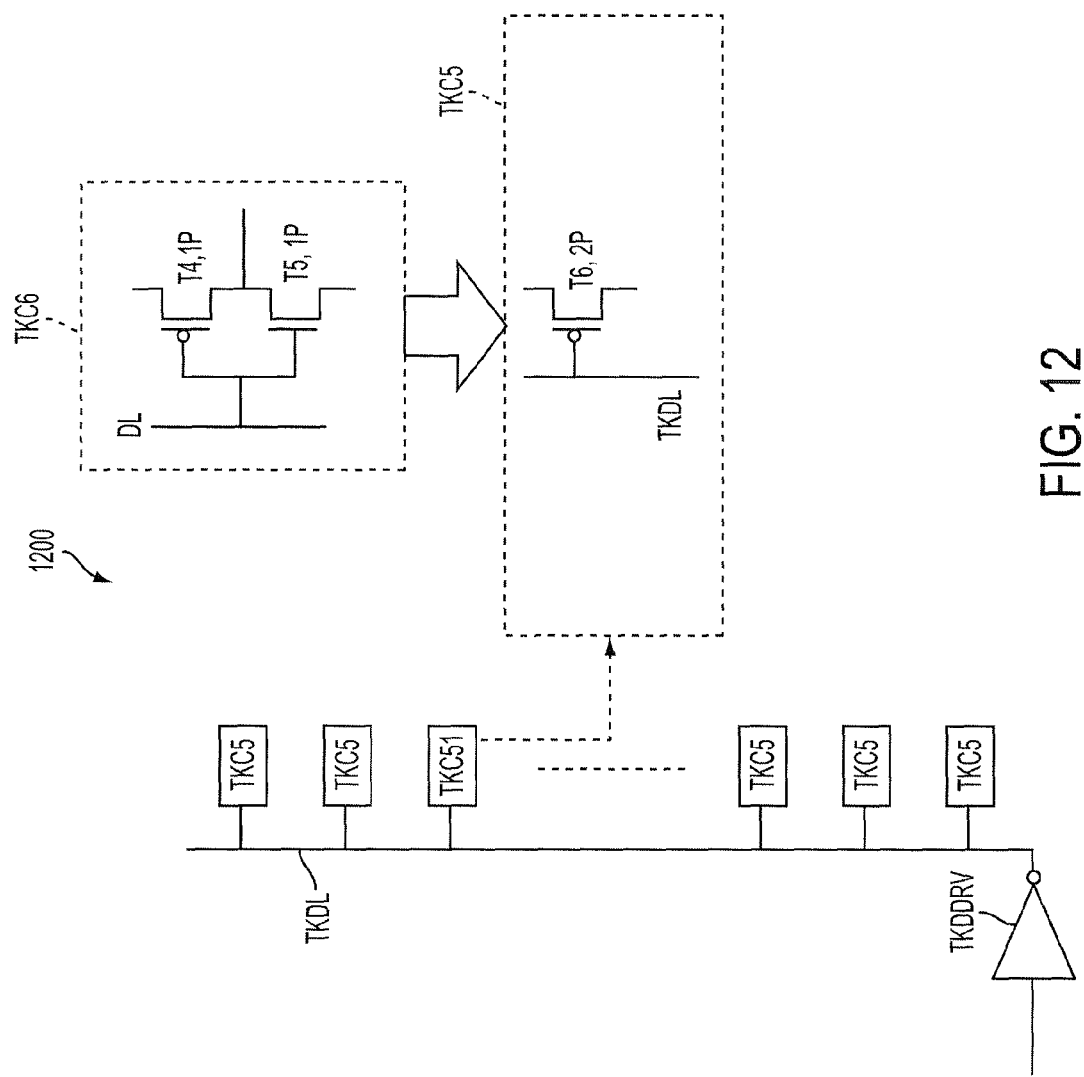
FIG. 12 is a diagram of an Xdecoder tracking circuit corresponding to the Xdecoder circuit in FIG. 11, in accordance with some embodiments.

FIG. 12 is a diagram of a circuit 1200, in accordance with some embodiments. Circuit 1200 is implemented as an embodiment of Xdecoder tracking circuit 320 based on circuit 1100.

Circuit 1200 includes a tracking data driver TKDDRV, a tracking data line TKDL, and a plurality of tracking cells TKC5. Circuit 1200 is derived from circuit 1100 in a manner similar to deriving circuit 400B from circuit 400A as illustrated in FIG. 4. For example, a driving capability of tracking data driver TKDDRV corresponds to a driving capability of data driver DDRV based on a reduction ratio RAT, such as 1/10, for another example. The number of tracking cells TKC5 corresponds to the number of logic cells LC, also based on reduction ratio RAT of 1/10. A size of tracking data driver TKDDRV, in some embodiments, is therefore 1/10 a size of data driver DDRV in FIG. 11.

Compared with the number of logic cells LC in FIG. 11, the number of tracking cells TKC5 is reduced by reduction ratio RAT of 1/10. In various embodiments, the number of logic gates in each group of logic gates is reduced by reduction ratio RAT of 1/10. For example, if a first group of logic gates includes 50 inverters, a first group of tracking cells includes 5 inverters. If a second group of logic gates includes 60 NAND gates, a second group of tracking cells includes 6 NAND gates, and if a third group of logic gates includes 40 OR gates, a third group of track cells includes 4 OR gates, etc.

A tracking cell TKC6 is shown to illustrate how tracking cell TKC5 is formed based on logic cell LC 1 in FIG. 11. Tracking cell TKC6 includes transistors T5 and T6 that are coupled with tracking data line TKDL, and that are part of a load for tracking data driver TKDDRV.

Using techniques illustrated with reference to FIG. 5, transistors T4 and T5 in tracking cell TKC6 are combined to form a transistor T6 in tracking cell TKC5. For example, each of transistors T4 and T5 has a size of P. In some embodiments, transistor T6 has a size of 2P, which is a total size of transistors T4 and T5.

Tracking cell TKC5 corresponding to logic cell LC1 that includes inverter INV11 is formed for illustration. Forming other tracking cells TKC5 corresponding to other logic gates are similar to forming tracking cell TKC5 as advanced above. For example, a logic cell LC includes a NAND gate, and three transistors corresponding to the NAND gate that are coupled with and affect tracking data line TKDL are identified. Another transistor having a size of three identified transistors is used in the corresponding tracking cell TKC5.

Tracking data line TKDL corresponds to data line DL in FIG. 11. In some embodiments, tracking data line TKDL has a different shape from a shape of data line DL, but has the same resistance as that of data line DL. Changing a shape of data line DL to result in tracking data line TKDL having the same resistance as that of data line DL is illustrated by deriving line 600B from line 600A in FIG. 6. Alternatively and/or additionally, changing a shape of data line DL to result in tracking data line TKDL having the same capacitance as that of data line DL is illustrated by deriving line 600C from line 600B in FIG. 6.

In some embodiments, input-output circuits to be tracked include logic cells similar to the situation in Xdecoder tracking circuit illustrated in FIGS. 11 and 12. Forming IO tracking circuit 330 based on the circuits to be tracked and a reduction ratio as illustrated in FIGS. 11 and 12 is similar to those for Xdecoder tracking circuit, and is not repeated herein.

Memory System, Further Embodiments

Figure 13:
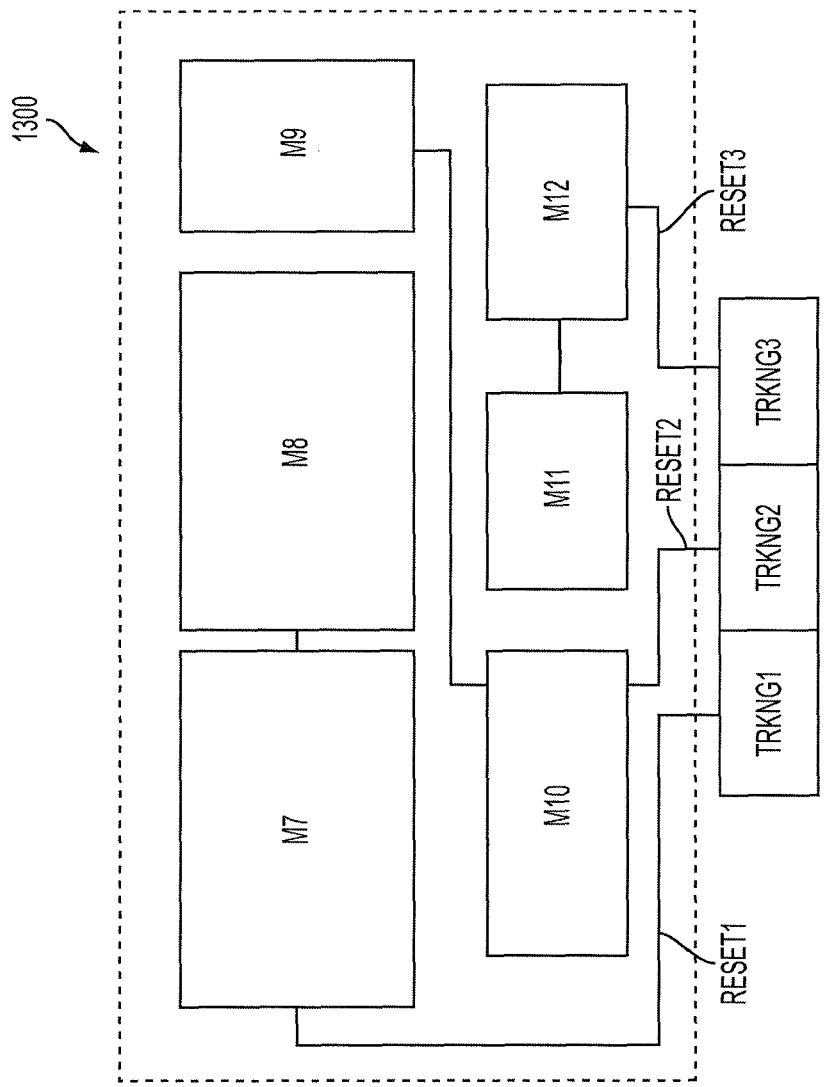
FIG. 13 is a diagram of another memory system, in accordance with some embodiments.

FIG. 13 is a diagram of a memory system 1300, in accordance with some further embodiments. Memory system 1300 includes six memory macros M7, M8, M9, M10, M11, and M12 and three tracking circuits TRKNG1, TRKNG2, and TRKNG3. Tracking circuit TRKNG1 is shared by memory macros M1 and M8. Tracking circuit TRKNG2 is shared by memory macros M9 and M10. Tracking circuit TRKNG3 is shared by memory macros M11 and M12. Tracking circuits TRKNG1, TRKNG2, and TRKNG3 generate reset signals RESET1, RESET2, and RESET3, respectively, to corresponding memory macros.

In some embodiments, memory macros selected to share the same tracking circuit are based on similarity of characteristics of the memory macros. For example, memory macros M7 and M8 are selected to share tracking circuit TRKNG1 if memory macros M7 and M8 have similar delays and loads in read and write signals and drivers. Tracking signals for memory macros M7 and M8 are therefore also similar. In various embodiments, memory macros having similar shapes of about the same number of bit lines and word lines are selected to share the same tracking circuit.

In some embodiments, each pair of memory macros M7, M8, each pair of memory macros M9, 10, and each pair of memory macros M11, M12 shares a same clock signal based on which read and write signals and read and write tracking signals are generated.

In FIG. 13, six memory macros are used for illustration. Another number of memory macros is within the scope of various embodiments. Three tracking circuits are used for illustration. Another number of tracking circuits is within the scope of various embodiments. Each tracking circuit being shared by a different number of memory macros is within the scope of various embodiments. For example, tracking circuit TRKNG1 is shared by two memory macros, while tracking circuit TRKNG2 is shared by another number of memory macros, such as 3, 4, or 5, etc. Similarly, tracking circuit TRKNG2 is also shared by another number of memory macros, such as 6, 7, or 8, etc.

Exemplary Method

Figure 14:
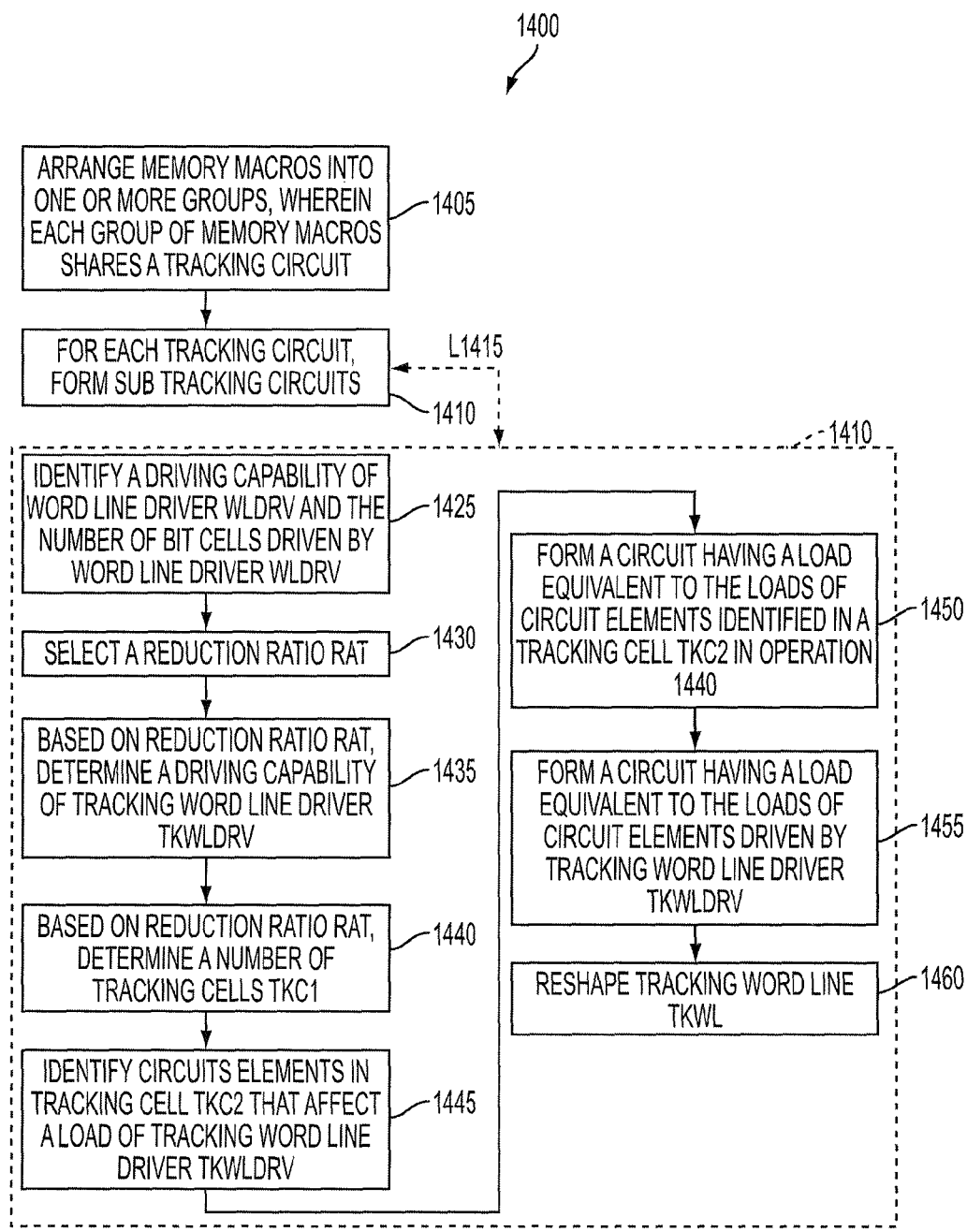
FIG. 14 is a flowchart of a method of forming shared tracking circuits in the memory system of FIG. 13, in accordance with some embodiments.

FIG. 14 is a flowchart of a method 400, in accordance with some embodiments.

In operation 1405, memory macros are arranged into one or more groups, wherein each group of memory macros shares a corresponding tracking circuit. In some embodiments, memory macros having a similar configuration such as having about the same number of bit lines and the same number of word lines are selected to share a tracking circuit. For example, memory macros M7 and M8 are selected to share tracking circuit TRKNG1. Memory macros M9 and M10 are selected to share tracking circuit TRKNG2, while memory macros M11 and M12 are selected to share tracking circuit TRKNG3, etc.

In operation 1410, for each tracking circuit, sub tracking circuits are formed. Details of forming sub tracking circuits for each tracking circuit are explained with reference to operations 1425 to 1460 as illustrated by a dotted line L1415.

For illustration, tracking circuit 310C, tracking circuit 310R, Xdecoder tracking circuit 320, and IO tracking circuit 330 are formed for tracking circuit TRKNG1. For another illustration, tracking circuit 800 is formed as an embodiment of tracking circuit 310C.

In operation 1425, a driving capability of word line driver WLDRV is identified. For illustration, the driving capability of word line driver WLDRV corresponds to size a SWLDRV. The number of bit cells BC driven by word line driver WLDRV is also identified.

In operation 1430, a reduction ratio RAT is selected. For illustration, a reduction ratio RAT having a value 1/10 is selected. In some embodiments, the value of reduction ratio RAT is selected based on an available layout area of shared tracking circuit TRKNG 210, an available die area of memory system 1300, or one or more other suitable parameters.

In operation 1435, based on reduction ratio RAT of 1/10, a driving capability of tracking word line driver TKWLDRV is determined. In some embodiments, a size STKWLDRV (not labeled) of tracking word line driver TKWLDRV is determined based on reduction ratio RAT and a size SWLDRV of word line driver WLDRV. As a result, size STKWLDRV of tracking word line driver TKWLDRV is selected to be 1/10 of size SWLDRV. Effectively, a driving capability of tracking word line driver TKWLDRV is about 1/10 a driving capability of word line driver WLDRV.

In operation 1440, the number of tracking cells TKC1 is determined based on reduction ratio RAT. For example, if the number of bit cells BC is 256, then the number of tracking cells TKC1 is determined to be 26 (~256/10).

In operation 1445, circuit elements in a tracking cell affecting a load of tracking word line TKWLDRV are identified. For example, transistors T1 and T2 in tracking cell TKC2 in FIG. 8 are identified. In some embodiments, a size of transistor T1 is the same as a size of transistor T2. For simplicity, a reference to transistor T1 refers to transistor T1 or T2, and a reference to a size of transistor T1 refers to a size of transistor T1 or T2. Because tracking circuit 800 includes 26 tracking cells TKC2 and each tracking cell TKC2 has two transistors T1 (or T2), tracking word line driver TKWLDRV drives a load of 52 transistors T1.

In operation 1450, a circuit having a load equivalent to the loads of circuit elements identified in a tracking cell TKC2 in operation 1445 is formed. For example, based on transistors T1 and T2, transistor T3 is formed to have a size twice a size of transistor T1. Transistor T3 is included in tracking cell TKC1. As a result, tracking word line driver TKWLDR in tracking circuit 800 drives 26 tracking cells TKC1 including 26 transistors T3.

In operation 1455, a circuit having a load equivalent to the loads of tracking cells TKC1 driven by tracking word line driver TKWLDRV is formed based on techniques illustrated in FIG. 5. For example, transistors corresponding to 26 transistors T3 of 26 tracking cells TKC1 are formed. For another example, 8 transistors T3' (not labeled) each having a size three times transistors T3 are formed to have a load equivalent to a load of 24 transistors T3. Further, one transistor T3" (not labeled) having a size two times that of transistors T3 is formed to have a load equivalent to a load of two transistors T3. As a result, a load of tracking circuit 800 includes eight transistors T3' and one transistor T3" to be equivalent to the load of 26 transistors T3. Further, a size of transistor T3' is six times a size of transistor T1 while a size of transistor T3" is four times a size of transistor T1. In other words, tracking word line driver TKWLDRV drives a load equivalent to a load of 52 transistors T1.

Operations 1450 and 1455 being illustrated in two separate operations are for illustration. In some embodiments, a total load of the number of transistors T1 and T2 coupled in tracking word line TKWL are determined. Based on the total load, the total number of transistors T3' and T3" having the same total loads are determined based on techniques illustrated with reference to FIG. 5. For example, there are 52 transistors T1 (or T2) coupled with tracking word line TKWL. The number of transistors T3' and T3" are determined based on 52 transistors T1 (or T2). For example, 8 transistors T3' is selected to have a load equivalent to a load of 48 transistors T1, and one transistor T3" to have a load equivalent to a load of four transistors T1, for a load equivalent to a load of 52 transistors T1. In other words, tracking word line driver TKWLDRV drives a load equivalent to a load of 52 transistors T1, which is consistent with the result after operation 1455.

In operation 1460, tracking word line TKWL is reshaped using techniques illustrated in FIG. 6. For example, in some embodiments, tracking word line TKWL is reshaped as illustrated in FIG. 600B, but retains the same resistance. Alternatively and/or additionally, tracking word line TKWL is reshaped as illustrated in FIG. 600C, but retains the same capacitance.

In FIG. 14, tracking circuit 800 implemented as tracking circuit 310C is used for illustration. Other circuits implemented as tracking circuit 310R, as Xdecoder tracking circuit 320, as IO tracking circuit 330 are similar in view of the present disclosure.

Computer System

Figure 15:
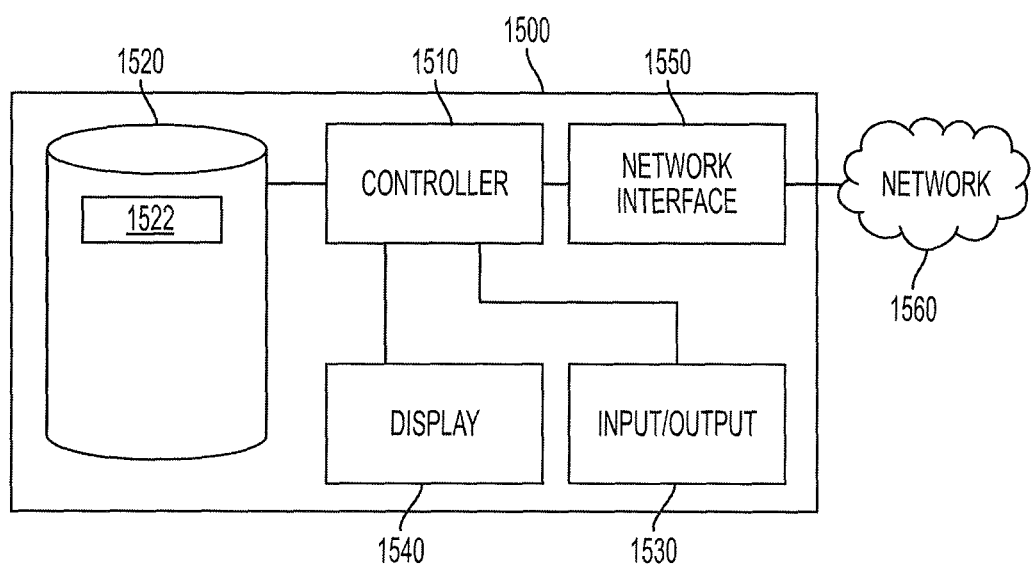
FIG. 15 is a diagram of a computer system, in accordance with some embodiments.

FIG. 15 is a functional block diagram of a computer system 1500, in accordance with some embodiment. In some embodiments, computer 1500 is used to implement various methods of the present disclosure, including, for example, method 1400 in FIG. 14.

A controller 1510 controls logic, processes information, and coordinates activities of computer system 1500. For example, controller 1510 is configured to execute computer program code 1522 to cause computer 1500 to implement method 1400. In some embodiments, controller 1510 is a central processing unit (CPU), a multi-processor, a distributed processing system, an application specific integrated circuit (ASIC), and/or a suitable processing unit.

Computer readable storage medium 1520 includes program code or a set of executable instructions 1522. Storage medium 1520 also stores information including, for example, information used to perform method 1400, information generated during performing method 1400, etc.

In some embodiments, storage medium 1520 is a non-transitory storage medium. For example, storage medium 1520 is an electronic, magnetic, optical, electromagnetic, infrared, and/or a semiconductor system, apparatus, or device. For another example, storage medium 1520 includes a semiconductor or solid-state memory, a magnetic tape, a removable computer diskette, a random access memory (RAM), a read-only memory (ROM), a rigid magnetic disk, and/or an optical disk. In some embodiments, storage medium 1520 includes a compact disk-read only memory (CD-ROM), a compact disk-read/write (CD-R/W), and/or a digital video disc (DVD).

An input-output interface 1530 enables a programmer to provide data to computer system 1500, to manipulate computer system 1500 to perform method 1400, for example.

A display 1540 displays information to users of computer 1500, including, for example, a status of operations of method 1400. In some embodiments, display 1540 includes a graphical user Interface (GUI). In some embodiments, input-output interface 1530 and display 1540 enable a user to operate computer system 1500 in an interactive manner.

A network interface 1550 enables computer system 1500 to communicate with a network 1560, to which one or more other computer systems are connected. Network interface 1550 includes wireless network interfaces such as BLUETOOTH, WIFI, WIMAX, GPRS, or WCDMA. Alternatively and/or additionally network interface 1550 includes a wired network interface such as an Ethernet, USB, or IEEE-1394 port. In some embodiments, computer system 1500 and at least one computer on network 1560 operate to perform functions of computer system 1500 as described above.

In some embodiments, a system comprises a plurality of first memory macros and a first tracking circuit to be shared by the plurality of first memory macros. The first tracking circuit includes at least one of a first tracking circuit associated with a row of memory cells of a first memory macro of the plurality of first memory macros, a first tracking circuit associated with a column of memory cells of the first memory macro of the plurality of first memory macros, a first decoder tracking circuit associated with decoding circuitries of the first memory macro of the plurality of first memory macros, and a first input-output tracking circuit associated with input-output circuitries of the first memory macro of the plurality of first memory macros.

Some embodiments regard a method of forming a tracking circuit. In the method a driver and a load of the driver in a circuit to be tracked are identified. A ratio is identified. In a tracking circuit used to track the circuit to be tracked, based on the ratio, a tracking driver corresponding to the driver and a tracking load of the tracking driver are identified.

In some embodiments, a system comprises a plurality of first memory macros and a first tracking circuit to be shared by the plurality of first memory macros. A circuit to be tracked in a memory macro of the plurality of memory macros includes a driver, a line, and a load. A sub tracking circuit of the first tracking circuit includes a tracking driver, a tracking line, and a tracking load. A driving capability of the tracking driver is related to a driving capability of the driver based on a ratio. The tracking load is related to the load based on the ratio.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A system comprising:
a plurality of first memory macros, each one of the plurality of first memory macros comprising a corresponding global control circuit configured to receive a common control signal; and
a first tracking circuit configured to generate the common control signal to be shared by the plurality of first memory macros,
wherein
the first tracking circuit includes at least one of
a first type tracking circuit associated with a row of memory cells of a first memory macro of the plurality of first memory macros;
a second type tracking circuit associated with a column of memory cells of the first memory macro of the plurality of first memory macros;
a decoder tracking circuit associated with decoding circuitry of the first memory macro of the plurality of first memory macros; and
an input-output tracking circuit associated with input-output circuitry of the first memory macro of the plurality of first memory macros.

2. The system of claim 1, further comprising:
a plurality of second memory macros; and
a second tracking circuit to be shared by the plurality of second memory macros,
wherein
the plurality of first memory macros shares a first clock signal; and
the plurality of second memory macros shares a second clock signal different from the first clock signal.

3. The system of claim 1, wherein
at least one of the first type tracking circuit associated with a row of memory cells, the second type tracking circuit associated with a column of memory cells, the decoder tracking circuit, or the input-output tracking circuit of the first tracking circuit includes a tracking driver, a tracking line, and a plurality of tracking cells;
the tracking driver corresponds to a driver;
the tracking line corresponds to a line; and
the plurality of tracking cells corresponds to a plurality of cells,
wherein
a driving capability of the tracking driver is related to a driving capability of the driver based on a ratio; and
a number of the plurality of tracking cells is related to a number of the plurality of cells based on the ratio.

4. The system of claim 1, wherein
at least one of the first type tracking circuit associated with a row of memory cells, the second type tracking circuit associated with a column of memory cells, the decoder tracking circuit, or the input-output tracking circuit of the first tracking circuit includes a tracking driver, a tracking line, and a plurality tracking cells;
the tracking driver corresponds to a driver;
the tracking line corresponds to a line; and
the plurality of tracking cells corresponds to a plurality of cells,
wherein
the line has a first shape, a first resistance value, and a first capacitance value;
the tracking line has a second shape, a second resistance value, and a second capacitance value;
the second shape is different from the first shape; and
the second resistance value is about the same as the first resistance value and/or the second capacitance value is about the same as the first capacitance value.

5. A method for generating a tracking circuit, the method comprising:
identifying a driver and a load of the driver in a circuit to be tracked;
identifying a ratio; and
in a tracking circuit used to track the circuit to be tracked, based on the ratio, identifying a tracking driver corresponding to the driver and a tracking load of the tracking driver.

6. The method of claim 5, wherein the tracking circuit is shared by a plurality of memory macros.

7. The method of claim 5, further comprising
identifying a first line corresponding to the load, wherein the line has a first shape; and
generating a second line having a second shape different from the first shape, wherein a resistance of the first line is about the same as a resistance of the second line and/or a capacitance of the first line is about the same as a capacitance of the second line.

8. The method of claim 5, further comprising
identifying circuit elements coupled with a line driven by the driver, wherein the circuit elements affect a value of the load.

9. The method of claim 5, wherein
a driving capability of the tracking driver is related to a driving capability of the driver based on the ratio; and
a number of circuit elements of the tracking load is related to a number of circuit elements of the load based on the ratio.

10. The method of claim 9, wherein
the circuit elements of the load include first transistors; and
the circuit elements of the tracking load include second transistors.

11. The method of claim 5, wherein
the tracking circuit is selected from a group consisting of a first tracking circuit, a second tracking circuit, a decoder tracking circuit, and an input-output tracking circuit;
the first tracking circuit is associated with a column of memory cells of a memory macro;
the second tracking circuit is associated with a row of memory cells of the memory macro;
the decoder tracking circuit is associated with decoder circuits of the memory macro; and
the input-output tracking circuit is associated with input-output circuits of the memory macro.

12. The method of claim 5, wherein
the driver is coupled with a line coupling a plurality of first transistors that affect a value of the load;
the tracking driver is coupled with a tracking line coupling a plurality of second transistors that affect a value of the tracking load; and
a size of a second transistor of the plurality of second transistors corresponds to a size of multiple first transistors of the plurality of first transistors.

13. The method of claim 5, wherein
the driver is coupled with a line coupling a plurality of first transistors that affect a value of the load;
the tracking driver is coupled with a tracking line coupling a plurality of second transistors that affect a value of the tracking load; and
a total size of the plurality of second transistors corresponds to a total size of the plurality of first transistors based on the ratio.

14. A system comprising:
a plurality of memory macros; and
a tracking circuit to be shared by the plurality of memory macros,
wherein
a sub circuit to be tracked in a memory macro of the plurality of memory macros includes a driver, a line, and a load;
a sub tracking circuit of the tracking circuit includes a tracking driver, a tracking line, and a tracking load;
a driving capability of the tracking driver is related to a driving capability of the driver based on a ratio; and
the tracking load is related to the load based on the ratio.

15. The system of claim 14, wherein
the ratio has a value different from one.

16. The system of claim 14, wherein
the load is asserted by a plurality of cells; and
the tracking load is asserted by a plurality of tracking cells.

17. The system of claim 14, wherein
the driver of the sub circuit is configured to drive a plurality of cells;
the tracking driver of the sub tracking circuit is configured to drive a plurality of tracking cells; and
a number of the plurality of tracking cells is related to a number of the plurality of cells based on the ratio.

18. The system of claim 14, wherein
the driver of the sub circuit is configured to drive a plurality of cells;
the tracking driver of the sub tracking circuit is configured to drive a plurality of tracking cells;
a cell of the plurality of cells includes a plurality of cell transistors;
a tracking cell of the plurality of tracking cells includes a tracking transistor; and
a size of the tracking transistor corresponds to a total size of the plurality of cell transistors.

19. The system of claim 14, wherein
the driver of the sub circuit is configured to drive a plurality of cells having a plurality of first transistors;
the tracking driver of the sub tracking circuit is configured to drive a plurality of tracking cells having a plurality of second transistors; and
a size of the plurality of the second transistors corresponds to a size of the plurality of the first transistors based on the ratio.

20. The system of claim 14, wherein
the driver of the sub circuit is configured to drive a plurality of cells having a plurality of first transistors;
the tracking driver of the sub tracking circuit is configured to drive a plurality of tracking cells having a plurality of second transistors; and
a size of a second transistor of the plurality of second transistors corresponds to a size of multiple first transistors of the plurality of first transistors.

21. The system of claim 14, wherein
the line has a first shape;
the tracking line has a second shape different from the first shape; and
a resistance value of the tracking line is about the same as a resistance value of the line and/or a capacitance value of the tracking line is about the same as a capacitance value of the line.

* * * * *